(12) United States Patent
Fang et al.

(10) Patent No.: US 10,797,019 B2
(45) Date of Patent: Oct. 6, 2020

(54) SEMICONDUCTOR PACKAGE AND METHOD FOR MANUFACTURING THE SAME

(71) Applicant: Advanced Semiconductor Engineering, Inc., Kaohsiung (TW)

(72) Inventors: Hsu-Nan Fang, Kaohsiung (TW); Chun-Jun Zhuang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/683,697

(22) Filed: Aug. 22, 2017

(65) Prior Publication Data

US 2018/0061805 A1    Mar. 1, 2018

Related U.S. Application Data

(60) Provisional application No. 62/381,995, filed on Aug. 31, 2016.

(51) Int. Cl.
*H01L 23/00* (2006.01)
*H01L 21/48* (2006.01)
*H01L 23/538* (2006.01)
(Continued)

(52) U.S. Cl.
CPC .......... *H01L 24/96* (2013.01); *H01L 21/4853* (2013.01); *H01L 21/4857* (2013.01); *H01L 21/561* (2013.01); *H01L 21/565* (2013.01); *H01L 21/568* (2013.01); *H01L 23/295* (2013.01); *H01L 23/3114* (2013.01);
(Continued)

(58) Field of Classification Search
CPC ................. H01L 24/96; H01L 23/5386; H01L 24/12–25; H01L 23/315; H01L 23/3114; H01L 2224/0235; H01L 2224/1703; H01L 23/3107; H01L 21/561; H01L 21/565; H01L 23/295
See application file for complete search history.

(56) References Cited

U.S. PATENT DOCUMENTS 7,750,467 B2   7/2010  Pu et al.
7,952,185 B2   5/2011  Theuss et al.
(Continued)

FOREIGN PATENT DOCUMENTS

CN    103035589 A    4/2013

OTHER PUBLICATIONS

Office Action for corresponding Chinese Patent Application No. 201710761169.2, dated Jun. 3, 2020, 7 pages.
Search Report (with English translation) for corresponding Chinese Patent Application No. 201710761169.2, dated Jun. 3, 2020, 4 pages.

*Primary Examiner* — Marcos D. Pizarro
*Assistant Examiner* — Antonio B Crite
(74) *Attorney, Agent, or Firm* — Foley & Lardner LLP

(57) ABSTRACT

A semiconductor package structure includes at least one semiconductor die, at least one conductive pillar, an encapsulant and a circuit structure. The semiconductor die has an active surface. The conductive pillar is disposed adjacent to the active surface of the semiconductor die. The encapsulant covers the semiconductor die and the conductive pillar. The encapsulant defines at least one groove adjacent to and surrounding the conductive pillar. The circuit structure is electrically connected to the conductive pillar.

15 Claims, 13 Drawing Sheets

(51) Int. Cl.
*H01L 25/065* (2006.01)
*H01L 21/56* (2006.01)
*H01L 23/29* (2006.01)
*H01L 23/31* (2006.01)
*H01L 25/00* (2006.01)

(52) U.S. Cl.
CPC ...... *H01L 23/5383* (2013.01); *H01L 23/5386* (2013.01); *H01L 24/16* (2013.01); *H01L 24/17* (2013.01); *H01L 24/19* (2013.01); *H01L 24/20* (2013.01); *H01L 25/0655* (2013.01); *H01L 25/50* (2013.01); *H01L 23/3128* (2013.01); *H01L 2224/16235* (2013.01); *H01L 2224/1703* (2013.01); *H01L 2224/18* (2013.01); *H01L 2224/95001* (2013.01); *H01L 2224/96* (2013.01); *H01L 2924/15311* (2013.01); *H01L 2924/181* (2013.01)

(56) References Cited

U.S. PATENT DOCUMENTS

| | | | |
|---|---|---|---|
| 2006/0046350 A1 | 3/2006 | Jiang et al. | |
| 2011/0074014 A1 | 3/2011 | Pagaila et al. | |
| 2012/0056316 A1* | 3/2012 | Pagaila | H01L 24/96 257/737 |
| 2012/0080768 A1* | 4/2012 | Juskey | H01L 21/561 257/528 |
| 2014/0175639 A1* | 6/2014 | Kim | H01L 23/49827 257/737 |
| 2015/0021763 A1* | 1/2015 | Na | H01L 23/295 257/737 |
| 2016/0104656 A1* | 4/2016 | Luan | H01L 21/561 257/738 |
| 2017/0365581 A1* | 12/2017 | Yu | H01L 25/0655 |

* cited by examiner

SEMICONDUCTOR PACKAGE AND METHOD FOR MANUFACTURING THE SAME

CROSS-REFERENCE TO RELATED APPLICATIONS

This application claims the benefit of and priority to U.S. Provisional Patent Application 62/381,995, filed on Aug. 31, 2016, which is incorporated herein by reference in its entirety.

BACKGROUND

1. Field of the Disclosure

The present disclosure relates to a semiconductor package structure and a manufacturing method, and more particularly to a semiconductor package structure including a conductive pillar exposed from an encapsulant, and a method for manufacturing the semiconductor package structure.

2. Description of the Related Art

In the present fan-out process, a semiconductor die is disposed in a "face up" manner on a carrier. The semiconductor die includes a plurality of conductive pillars on an active surface opposite to the carrier. Then, a molding compound is applied to cover the semiconductor die, the conductive pillars, and the carrier. After such molding operation, the molding compound is thinned to expose upper surfaces of the conductive pillars (by, e.g., a grinding process). Then, a redistribution layer (RDL) is formed on the molding compound to contact the conductive pillars. However, since the conductive pillars may not have a consistent height, it is challenging to thin the molding compound to ensure that all the upper surfaces of the conductive pillars are exposed.

SUMMARY

In some embodiments, a semiconductor package structure includes at least one semiconductor die, at least one conductive pillar, an encapsulant and a circuit structure. The semiconductor die has an active surface. The conductive pillar is disposed adjacent to the active surface of the semiconductor die. The encapsulant covers the semiconductor die and the conductive pillar. The encapsulant defines at least one groove adjacent to and surrounding the conductive pillar. The circuit structure is electrically connected to the conductive pillar.

In some embodiments, a semiconductor package structure includes at least one semiconductor die, at least one conductive pillar, an encapsulant, a dielectric layer and a circuit structure. The semiconductor die has an active surface. The conductive pillar is disposed adjacent to the active surface of the die. The encapsulant covers the semiconductor die and the conductive pillar. The dielectric layer is disposed on the encapsulant. The dielectric layer includes a protrusion surrounding the conductive pillar. The circuit structure is electrically connected to the conductive pillar.

In some embodiments, a method for manufacturing a semiconductor package structure includes (a) disposing a sacrificial component on a carrier and disposing a dielectric material to cover the sacrificial component and the carrier; (b) attaching a semiconductor die to the carrier, wherein the semiconductor die includes at least one conductive pillar disposed adjacent to an active surface of the semiconductor die, and the conductive pillar penetrates through the dielectric material to contact the sacrificial component; (c) forming an encapsulant to cover the semiconductor die; (d) removing the carrier, the sacrificial component and the dielectric material to expose the conductive pillar; and (e) forming a circuit structure to electrically connect to the conductive pillar.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
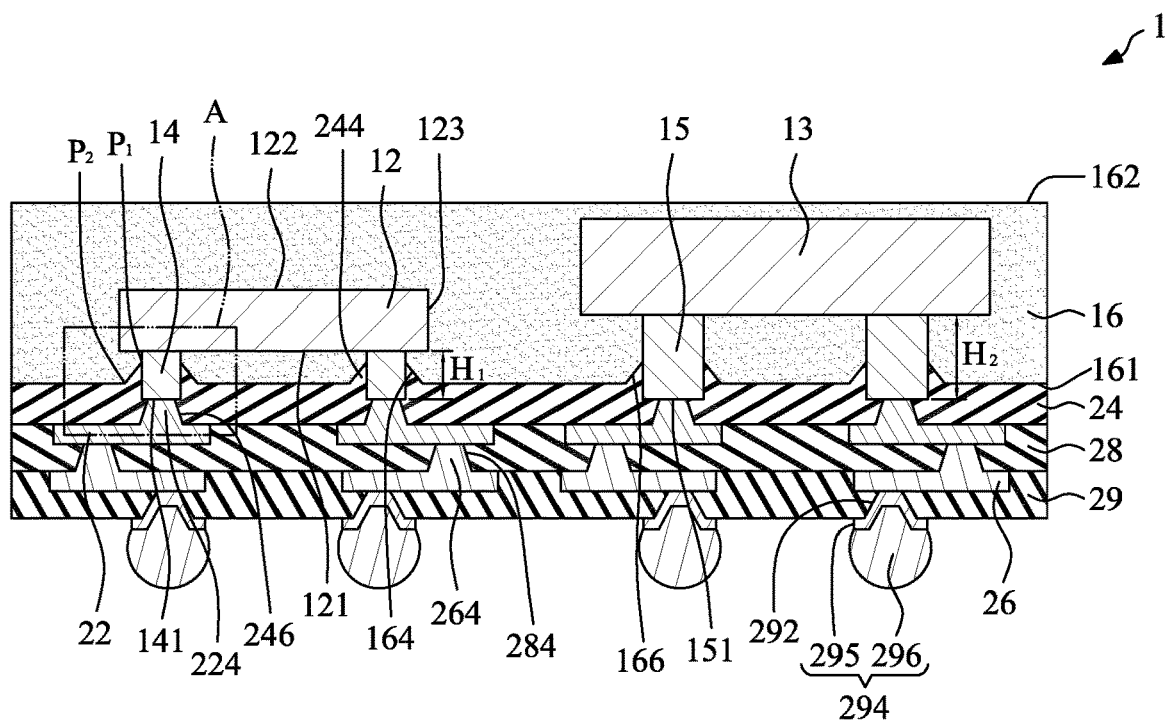
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a semiconductor package structure includes at least one semiconductor die, at least one conductive pillar disposed on the semiconductor die, and an encapsulant covering the semiconductor die and the conductive pillar. The encapsulant defines at least one groove adjacent to and surrounding the respective conductive pillar. At least some embodiments of the present disclosure further disclose techniques for manufacturing the semiconductor package structure.

In a comparative fan-out process, a semiconductor die is disposed in a "face up" manner on a carrier. That is, the semiconductor die has an active surface and a back side surface opposite to the active surface, and the back side surface of the semiconductor die is attached (e.g., adhered) to the carrier. The semiconductor die includes a plurality of conductive pillars on the active surface. Then, a molding compound is applied to cover the semiconductor die, the conductive pillars, and the carrier. In other words, an upper surface of the molding compound is higher than upper surfaces of the conductive pillars, since the molding compound covers the conductive pillars.

After the molding operation, a grinding operation is conducted to remove an upper part of the molding compound that is disposed on the upper surfaces of the conductive pillars, to thin the molding compound and expose the upper surfaces of the conductive pillars. In one embodiment, after grinding, the upper surface of the molding compound may be substantially coplanar with the upper surfaces of the conductive pillars if the conductive pillars have a consistent height. However, in some embodiments, the conductive pillars may not have a consistent height, especially when the aforementioned process is used for packaging a plurality of semiconductor dice having different sizes at the same time. As a result, the upper surfaces of the conductive pillars of the semiconductor dice may not be coplanar with each other. Thus, after the grinding operation, a portion of the conductive pillars may still be embedded in the molding compound and the upper surfaces of these conductive pillars may not be exposed from the molding compound. A redistribution layer (RDL) is formed on the molding compound and may not contact and electrically connect the unexposed conductive pillars, which results in an open circuit.

The present disclosure addresses at least the above concerns and provides an improved semiconductor package structure, and improved techniques for manufacturing the semiconductor package structure. In the manufacturing process of the semiconductor package structure, the grinding operation can be omitted, while each one of upper surfaces of conductive pillars can be exposed.

Figure 2:
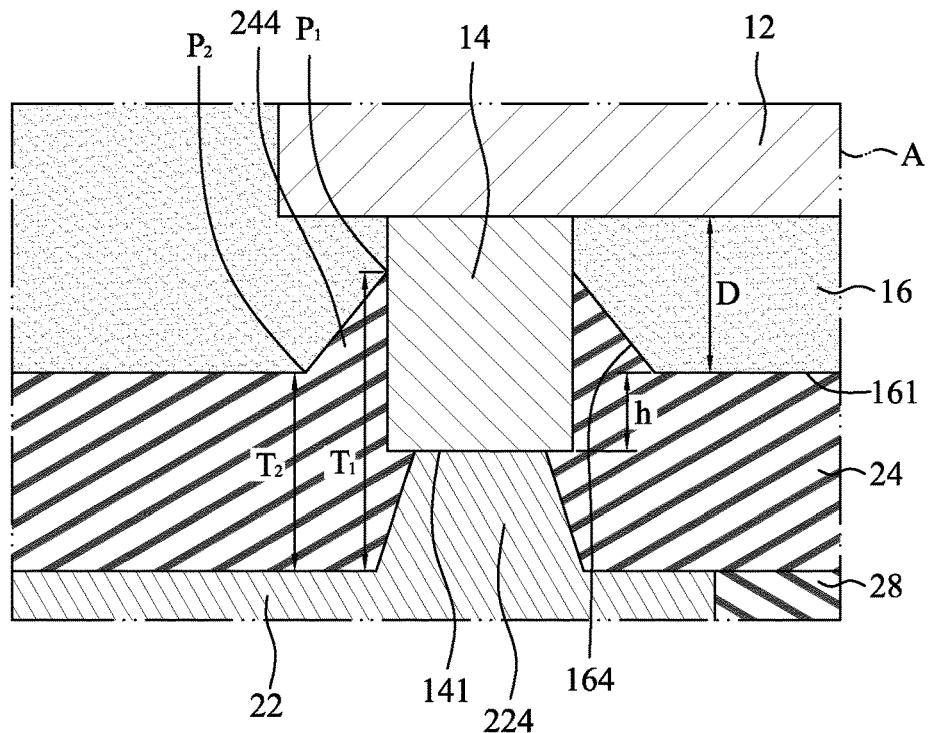
FIG. 2 illustrates an enlarged view of an area A in FIG. 1 according to some embodiments of the present disclosure.

FIG. 1 illustrates a cross-sectional view of a semiconductor package structure 1 according to some embodiments of the present disclosure. FIG. 2 illustrates an enlarged view of an area A in FIG. 1. The semiconductor package structure 1 may include at least one semiconductor die (e.g., a first semiconductor die 12 and a second semiconductor die 13), at least one conductive pillar (e.g., a first conductive pillar 14 and a second conductive pillar 15), an encapsulant 16, a first dielectric layer 24, a first circuit structure 22, a second dielectric layer 28, a second circuit structure 26, a third dielectric layer 29, and at least one external connector 294.

As shown in FIG. 1, the semiconductor package structure 1 may include the first semiconductor die 12 and the second semiconductor die 13. The first semiconductor die 12 has an active surface 121, a back side surface 122 opposite to the active surface 121, and a lateral surface 123 extending between the active surface 121 and the back side surface 122. A structure of the second semiconductor die 13 is similar to that of the first semiconductor die 12. In some embodiments, a size of the second semiconductor die 13 may be substantially the same as, or similar to, a size of the first semiconductor die 12. The back side surface 122 of the first semiconductor die 12 may be substantially coplanar with the back side surface of the second semiconductor die 13. However, in some other embodiments, the size of the second semiconductor die 13 may be different from the size of the first semiconductor die 12, and the back side surface 122 of the first semiconductor die 12 may be not substantially coplanar with the back side surface of the second semiconductor die 13.

As shown in FIG. 1, the semiconductor package structure 1 may include at least one first conductive pillar 14 and at least one second conductive pillar 15. Materials of the first conductive pillar 14 and the second conductive pillar 15 may include a conductive metal, such as copper (Cu). A size of the first conductive pillar 14 may be substantially the same as or different from a size of the second conductive pillar 15. The first conductive pillar 14 is disposed adjacent to the active surface 121 of the first semiconductor die 12 and electrically connected to the first semiconductor die 12. Similarly, the second conductive pillar 15 is disposed on and electrically connected to the second semiconductor die 13. A height $H_1$ of the first conductive pillar 14 may be substantially the same, or different from, a height $H_2$ of the second conductive pillar 15. As shown in FIG. 1, the height $H_1$ of the first conductive pillar 14 is smaller than the height $H_2$ of the second conductive pillar 15. The first conductive pillar 14 has an end surface 141. The second conductive pillar 15 has an end surface 151. The end surface 141 of the first conductive pillar 14 is substantially coplanar with the end surface 151 of the second conductive pillar 15.

The encapsulant 16 may be a molding compound. The encapsulant 16 covers at least a portion of the first semiconductor die 12 and at least a portion of the first conductive pillar 14. As show in FIG. 1, the encapsulant 16 covers the active surface 121, the back side surface 122 and the lateral surface 123 of the first semiconductor die 12. The encapsulant 16 defines a groove 164 adjacent to and surrounding the respective first conductive pillar 14. For example, the groove 164 may be an annular groove.

As shown in FIG. 1, the encapsulant 16 may also cover the second semiconductor die 13 and at least a portion of the second conductive pillar 15. Besides, the encapsulant 16 may define another groove 166 adjacent to and surrounding the respective second conductive pillar 15. For example, the groove 166 may be an annular groove. As shown in FIG. 1, in some embodiments, a maximum depth of the groove 164 surrounding the first conductive pillar 14 may be substantially the same as a maximum depth of the groove 166 surrounding the second conductive pillar 15. However, in some other embodiments, the maximum depth of the groove 164 surrounding the first conductive pillar 14 may differ from that of the groove 166 surrounding the second conductive pillar 15.

The encapsulant 16 has a first surface 161 and a second surface 162 opposite to the first surface 161. The first surface 161 is adjacent to the active surface 121 of the first semiconductor die 12. The second surface 162 may be above the first semiconductor die 12 and the second semiconductor die 13.

The first dielectric layer 24 is disposed on the first surface 161 of the encapsulant 16 and in the grooves 164, 166 of the encapsulant 16. As shown in FIG. 1, in some embodiments, the first conductive pillar 14 and the second conductor pillar 15 do not extend fully through the first dielectric layer 24. However, in some other embodiments, the first conductive pillar 14 and the second conductor pillar 15 may extend fully through the first dielectric layer 24, which is described in following passages referring to FIG. 4. The first dielectric layer 24 includes a protrusion 244 surrounding the first conductive pillar 14. As shown in FIG. 1, the protrusion 244 of the first dielectric layer 24 may be conformal with and filled in the grooves 164, 166 defined by the encapsulant 16. The first dielectric layer 24 defines a plurality of openings 246 to expose the end surface 141 of the first conductive pillar 14 and the end surface 151 of the second conductive pillar 15. A material of the first dielectric layer 24 may be epoxy or polyimide (PI) including photoinitiators, and the opening 246 may be formed by, e.g., lithography techniques.

The first circuit structure 22 may include a redistribution layer (RDL). As shown in FIG. 1, the first circuit structure 22 is disposed on the first dielectric layer 24 and in the openings 246 of the first dielectric layer 24. The first circuit structure 22 is electrically connected to the first conductive pillars 14 and the second conductive pillars 15. For example, the first circuit structure 22 may include a plurality of vias 224 disposed in the openings 246 of the first dielectric layer 24 and contacting the end surface 141 of the first conductive pillar 14 and the end surface 151 of the second conductive pillar 15.

The second dielectric layer 28 is disposed on the first dielectric layer 24 and covers at least a portion of the first circuit structure 22. The second dielectric layer 28 defines at least one opening 284 to expose a portion of the first circuit structure 22. A material of the second dielectric layer 28 may be epoxy or PI including photoinitiators, and the opening 284 may be formed by, e.g., lithography techniques. The material of the second dielectric layer 28 may be the same as, or different from, that of the first dielectric layer 24.

The second circuit structure 26 may include a redistribution layer (RDL). As shown in FIG. 1, the second circuit structure 26 is disposed on the second dielectric layer 28 and in the opening 284 of the first dielectric layer 28. The second circuit structure 26 is electrically connected to the first circuit structure 22. For example, the second circuit structure 26 may include at least one via 264 disposed in the opening 284 of the second dielectric layer 28 and contacting the first circuit structure 22. A line width/line space (L/S) of the second circuit structure 26 may be substantially the same as, or different from, a line width/line space (L/S) of the first circuit structure 22.

The third dielectric layer 29 is disposed on the second dielectric layer 28 and covers at least a portion of the second circuit structure 26. The third dielectric layer 29 defines at least one opening 292 to expose a portion of the second circuit structure 26. A material of the third dielectric layer 29 may be epoxy or PI including photoinitiators, and the opening 292 may be formed by, e.g., lithography techniques. The material of the third dielectric layer 29 may be the same as, or different from, those of the first dielectric layer 24 and the second dielectric layer 28.

The external connector 294 is disposed in the opening 292 of the third dielectric layer 29 and electrically connected to the second circuit structure 26. The external connector 294 may include an under bump metallization (UBM) layer 295 and a solder ball 296. The UBM layer 295 is disposed in the opening 292 of the third dielectric layer 29 and contacts the second circuit structure 26. The solder ball 296 is disposed on the UBM layers 295 for external connection, and is electrically connected to the second circuit structure 26 through the UBM layer 295.

FIG. 2 illustrates an enlarged view of the area A in FIG. 1. As shown in FIG. 2, the first dielectric layer 24 has a first thickness $T_1$ at a first position $P_1$ and a second thickness $T_2$ at a second position $P_2$. The first position $P_1$ is closer to the first conductive pillar 14 than the second position $P_2$. The first thickness $T_1$ is greater than the second thickness $T_2$, such as about 1.1 times or greater, about 1.2 times or greater, about 1.3 times or greater, or about 1.5 times or greater. As shown in FIG. 2, a height h of a portion of the first conductive pillar 14 protruding from the encapsulant 16 is smaller than a minimum thickness of the first dielectric layer 24 (e.g., the second thickness $T_2$ of the first dielectric layer 24 at the second position $P_2$). The encapsulant 16 may include a plurality of fillers (e.g., filler particles) with an average diameter. In some embodiment, the average diameter refers to an average diameter of filler particles of the encapsulant 16. A distance D is defined between the first surface 161 of the encapsulant 16 and the active surface 121 of the first semiconductor die 12. In some embodiments, the distance D is greater than, or substantially equal to, about three times the average diameter of the fillers so that the fillers of the encapsulant 16 can enter a space between the first surface 161 of the encapsulant 16 and the active surface 121 of the first semiconductor die 12 smoothly. In some embodiments, if the semiconductor package structure 1 includes a plurality of semiconductor dice, the distance D may be defined as a minimum distance between the first surface 161 of the encapsulant 16 and the active surfaces of the semiconductor dice.

The semiconductor package structure 1 of the present disclosure can be manufactured without the grinding operation to expose the conductive pillars (e.g., the first conductive pillar 14 and the second conductive pillar 15). Accordingly, manufacturing cost of the grinding operation can be eliminated. Even though semiconductor package structure 1 includes plural semiconductor dice (e.g., the first semiconductor die 12 and the second semiconductor die 13) which may include conductive pillars (e.g., the first conductive pillar 14 and the second conductive pillar 15) having different heights, end surfaces 141, 151 of the conductive pillars 14, 15 are substantially coplanar with each other. Hence, the conductive pillars 14, 15 can be properly connected to the first circuit structure 22.

Figure 3:
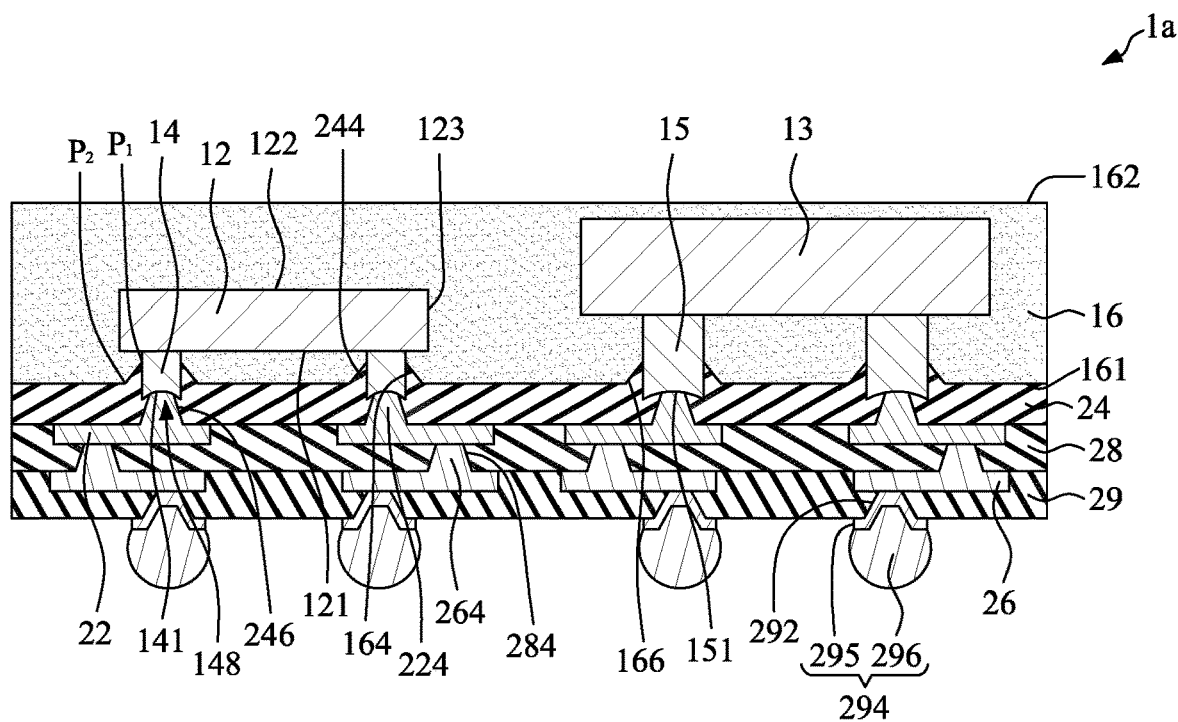
FIG. 3 illustrates a cross-sectional view of a semiconductor package structure according to some embodiments of the present disclosure.

FIG. 3 illustrates a cross-sectional view of a semiconductor package structure 1a according to some embodiments of the present disclosure. The semiconductor package structure 1a is similar to the semiconductor package structure 1 shown in FIGS. 1 and 2, except that the end surface 141 of the first conductive pillar 14 defines a recess portion 148. Accordingly, the first circuit structure 22 extends into the recess portion 148 defined by the end surface 141 of the first conductive pillar 14. For example, the via 224 of the first circuit structure 22 extends into the recess portion 148 defined by the end surface 141 of the first conductive pillar 14.

Figure 4:
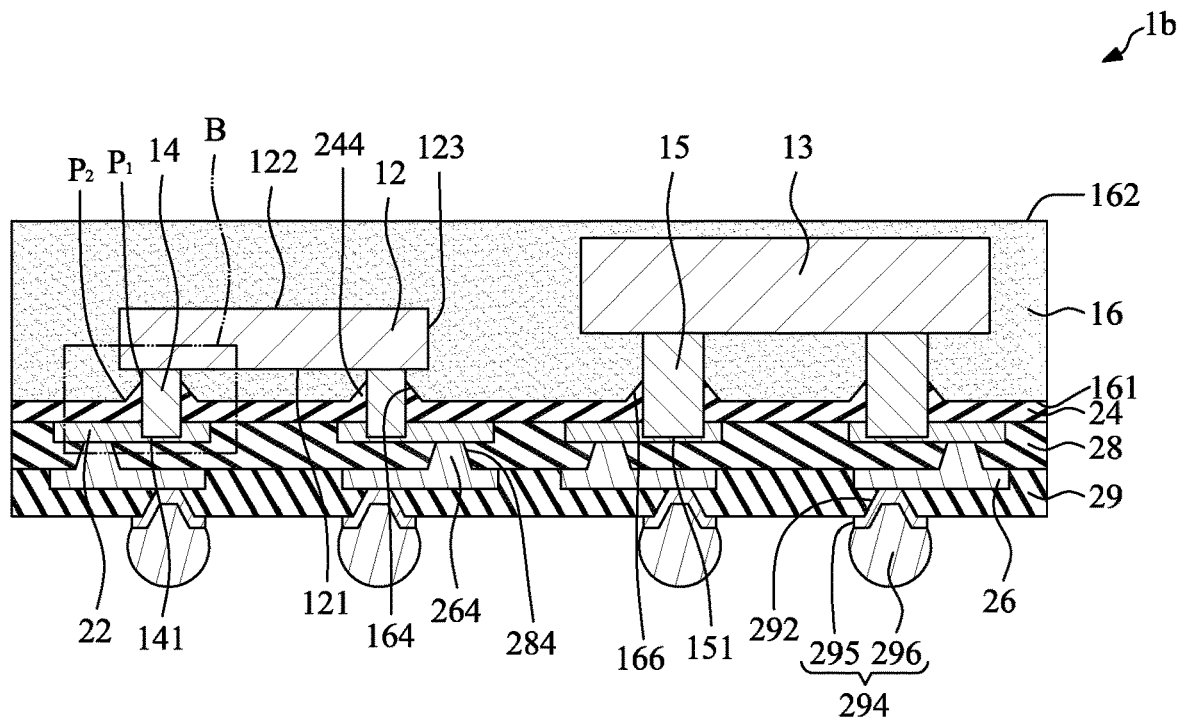
FIG. 4 illustrates a cross-sectional view of a semiconductor package structure according to some embodiments of the present disclosure.
Figure 5:
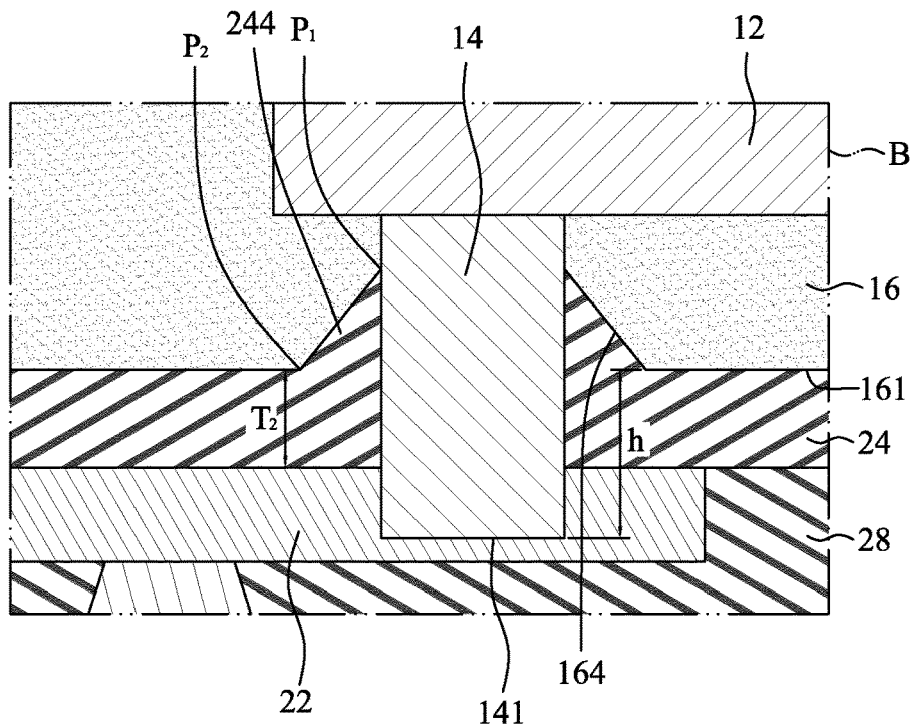
FIG. 5 illustrates an enlarged view of an area B in FIG. 4 according to some embodiments of the present disclosure.

FIG. 4 illustrates a cross-sectional view of a semiconductor package structure 1b according to some embodiments of the present disclosure. FIG. 5 illustrates an enlarged view of an area B in FIG. 4. The semiconductor package structure 1b is similar to the semiconductor package structure 1 shown in FIGS. 1 and 2, except that the first conductive pillar 14 and the second conductive pillar 15 extend fully through the first dielectric layer 24, and the via 224 of the first circuit structure 22 (as shown in FIG. 1) may be omitted. As shown in FIG. 4, the first conductive pillar 14 protrudes from the first dielectric layer 24, and the end surface 141 of the first conductive pillar 14 is embedded in the first circuit structure 22. Accordingly, referring to FIG. 5, the height h of the portion of the first conductive pillar 14 protruding from the encapsulant 16 may be greater than the minimum thickness of the first dielectric layer 24 (e.g., the second thickness $T_2$ of the first dielectric layer 24 at the second position $P_2$).

Figure 6:
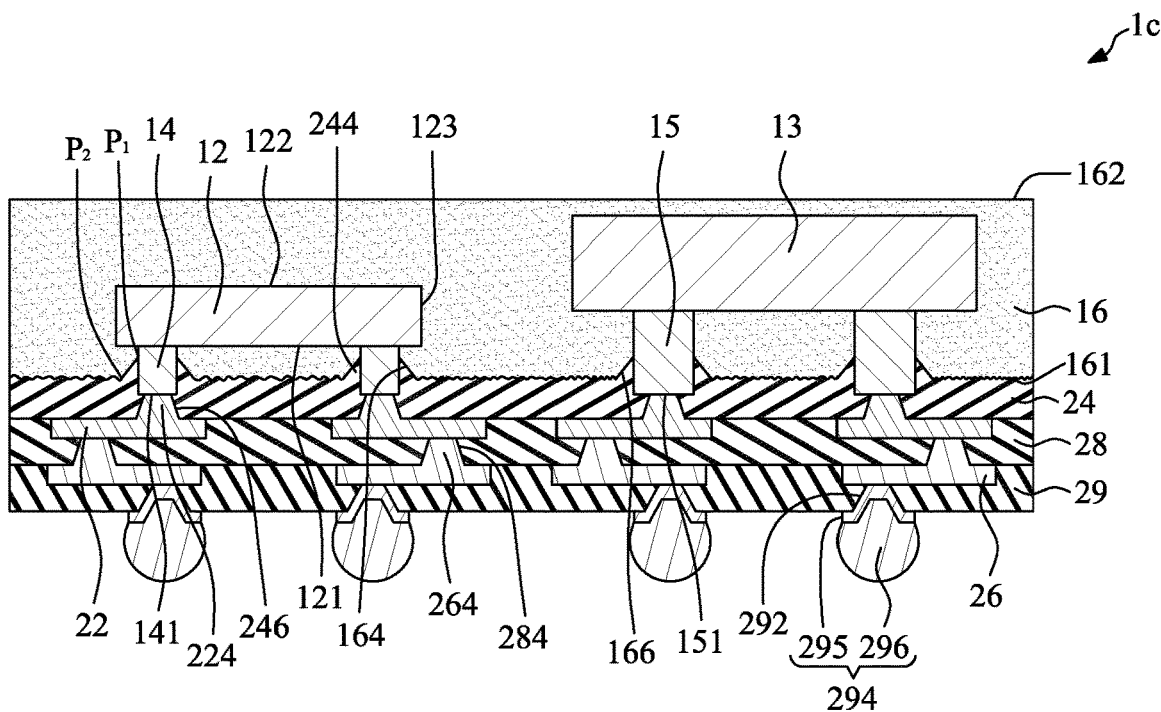
FIG. 6 illustrates a cross-sectional view of a semiconductor package structure according to some embodiments of the present disclosure.

FIG. 6 illustrates a cross-sectional view of a semiconductor package structure 1c according to some embodiments of the present disclosure. The semiconductor package structure 1c is similar to the semiconductor package structure 1 shown in FIGS. 1 and 2, except that a roughness (Ra) of the first surface 161 of the encapsulant 16 is greater than about 0.008 micrometers (μm), such as about 0.01 μm or greater, or about 0.02 μm or greater. The roughness of the first surface 161 provides for an improved adhesion between the encapsulant 16 and the first dielectric layer 24.

FIG. 7 to FIG. 16 illustrate various stages of a method for manufacturing a semiconductor package structure according to some embodiments of the present disclosure. In some embodiments, the method is for manufacturing a semiconductor package structure such as the semiconductor package structure 1 shown in FIGS. 1 and 2. In the initial stages of some embodiments, a carrier 60, a sacrificial component 62 and a dielectric material 64 are provided as follows.

Figure 7:
FIG. 7 illustrates one or more stages of an example of a method for manufacturing a semiconductor package structure according to some embodiments of the present disclosure.

Referring to FIG. 7, the carrier 60 is provided. The carrier 60 may include, for example, a metal or a glass material, or may be another substrate. The carrier 60 may optionally include a layer or film of material disposed thereon, such as a thermal release material.

Figure 8:
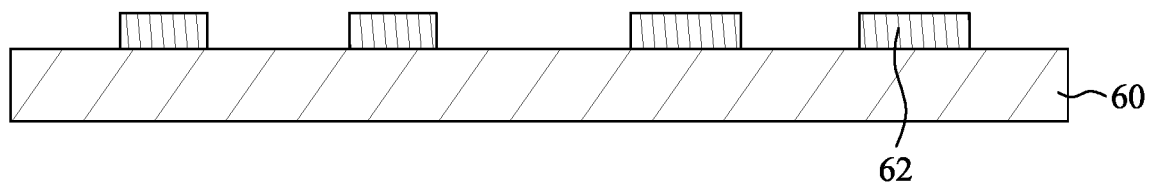
FIG. 8 illustrates one or more stages of an example of a method for manufacturing a semiconductor package structure according to some embodiments of the present disclosure.

Referring to FIG. 8, a sacrificial component 62 is formed or disposed on the carrier 60. The sacrificial component 62 may be a metal pad, and may be formed by, e.g., lithography techniques. For example, the sacrificial component 62 may be formed by applying a seed layer over the carrier 60, plating a metal layer over the seed layer, disposing a mask over the metal layer, and etching portions of the metal layer exposed by the mask. One or both of the seed layer and the metal layer may include copper or another metal or metal alloy. As disclosed in the subsequent stages, the sacrificial component 62 helps to define a surface of an encapsulant (such as the encapsulant 16 shown in FIG. 1) and a height of a portion of a conductive pillar protruding from the encapsulant (such as the height h of the portion of the first conductive pillar 14 shown in FIG. 2).

The sacrificial component 62 may be made of a plastic material, such as polypropylene (PP) or polystyrene (PS). As illustrated in FIG. 8, in some embodiments, the sacrificial component 62 may bond tightly to carrier 60. However, in some other embodiments, the bonding strength between the sacrificial component 62 and the carrier 60 may be weak. As shown in FIG. 8, a plurality of sacrificial components 62 is formed or disposed on the carrier 60, and top surfaces of the sacrificial components 62 may be substantially coplanar. In some other embodiment, the sacrificial components 62 may be formed integrally with the carrier 60. That is, there are no boundaries between the sacrificial components 62 and the carrier 60. The carrier 60 with the sacrificial components 62 may be formed by etching an initial carrier that is thicker than the carrier 60 as illustrated in FIG. 8. In some embodiments, the sacrificial components 62 may include, for example, a metal or a glass material, or another substrate material. The sacrificial components 62 may optionally include, e.g., a thermal release material.

Figure 9:
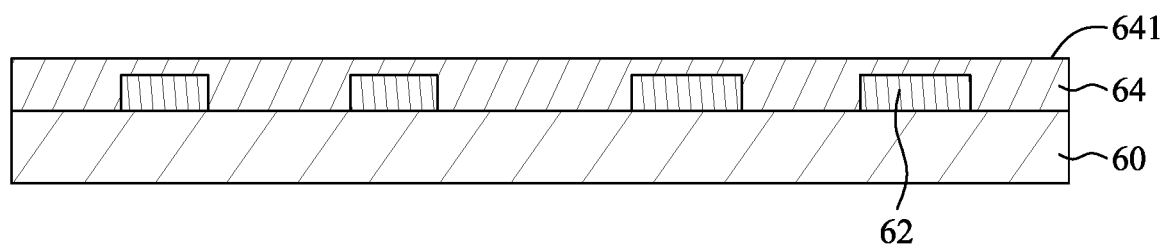
FIG. 9 illustrates one or more stages of an example of a method for manufacturing a semiconductor package structure according to some embodiments of the present disclosure.

Referring to FIG. 9, a dielectric material 64 is provided on the carrier 60 and covers the carrier 60 and the sacrificial components 62. The dielectric material 64 includes an exposed surface 641 away from the carrier 60. The dielectric material 64 may be an adhesive material, such as an adhesive film or a glue (e.g., A4012 produced by Tokyo Ohka Kogyo Co., Ltd. (TOK)). The dielectric material 64 may be a dry film or may be applied in a liquid form. After being applied on the carrier 60, the dielectric material 64 may be pre-cured or partially cured (e.g., about 180° C., about 10 minutes) to be in a B-stage.

Figure 10:
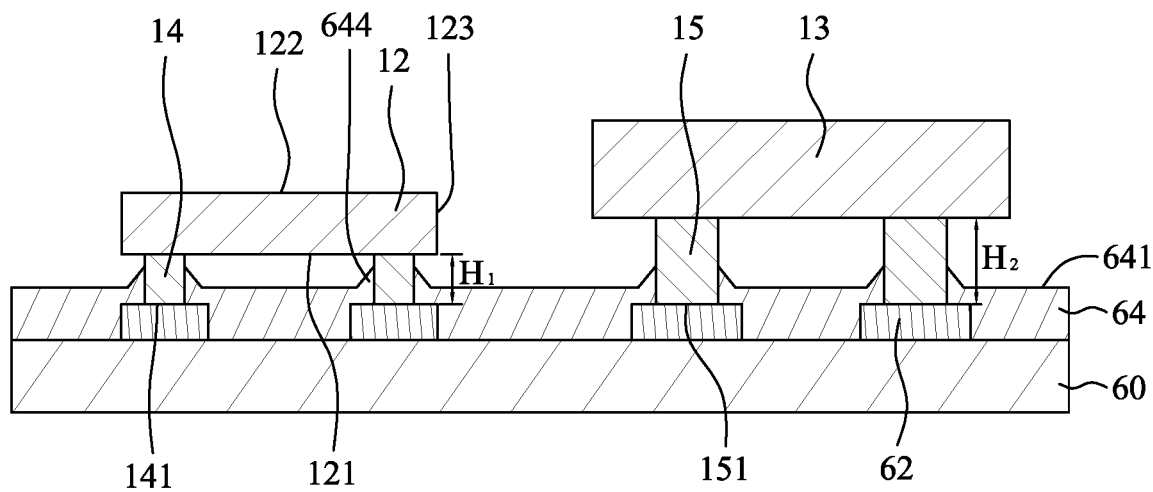
FIG. 10 illustrates one or more stages of an example of a method for manufacturing a semiconductor package structure according to some embodiments of the present disclosure.

Referring to FIG. 10, a first semiconductor die 12 is attached to the carrier 60. The first semiconductor die 12 includes an active surface 121, a back side surface 122 opposite to the active surface 121, and a lateral surface 123 extending between the active surface 121 and the back side surface 122. The first semiconductor die 12 includes at least one first conductive pillar 14 disposed adjacent to the active surface 121. The first conductive pillar 14 includes an end surface 141. When attaching the first semiconductor die 12 to the carrier 60, the first conductive pillar 14 penetrates through the dielectric material 64 to contact the sacrificial component 62.

Figure 11:
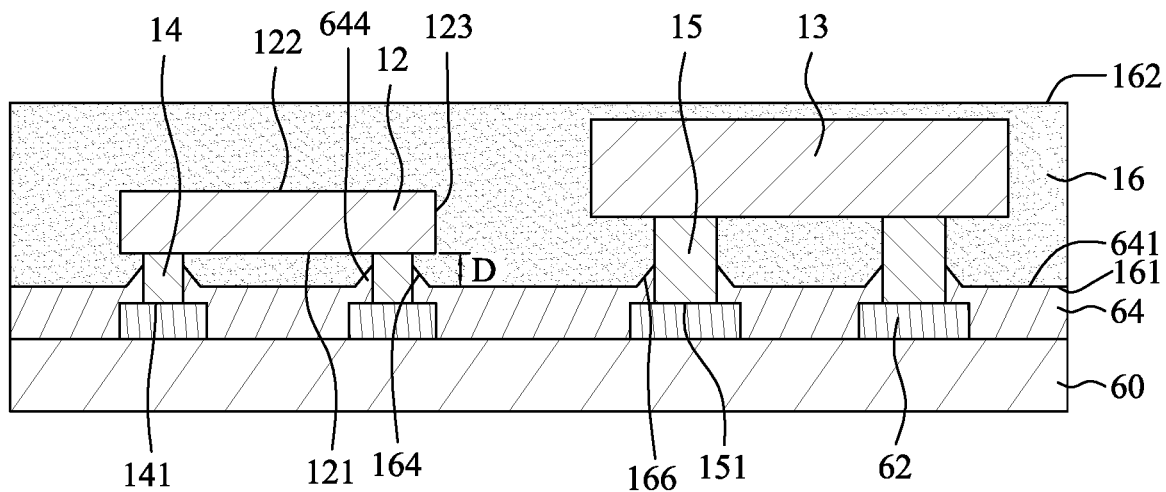
FIG. 11 illustrates one or more stages of an example of a method for manufacturing a semiconductor package structure according to some embodiments of the present disclosure.

The vertical position of the first semiconductor die 12 relative to the carrier 60 may be determined by the dielectric material 64 and the sacrificial component 62. The sacrificial component 62 positions the first conductive pillar 14 in a manner that the first conductive pillar 14 will be exposed from a surface of an encapsulant (e.g., the first surface 161 of the encapsulant 16, as shown in FIG. 11) at a subsequent stage, thus the grinding operation for exposing the first conductive pillar 14 can be omitted.

The end face 141 of the first conductive pillar 14 physically contacts a respective sacrificial component 62. However, in some other embodiments, multiple conductive pillars (e.g., multiple first conductive pillars 14, or the first conductive pillar 14 and the second conductive pillar 15) can be disposed on and contact a sacrificial component 62.

Due to capillary phenomenon, a portion of the dielectric material 64 may flow along the first conductive pillar 14 towards the first semiconductor die 12, forming a protrusion 644 adjacent to the first conductive pillar 14 as shown in FIG. 10. That is, the dielectric material 64, which may be in the B-stage, includes the protrusion 644 surrounding the first conductive pillar 14.

Similarly, a second semiconductor die 13 may be attached to the carrier 60. The second semiconductor die 13 includes at least one second conductive pillar 15. A height $H_2$ of the second conductive pillar 15 may differ from a height $H_1$ of the first conductive pillar 14. The second conductive pillar 15 penetrates through the dielectric material 64, and an end surface 151 of the second conductive pillar 15 physically contacts another one of the sacrificial components 62. Since the top surfaces of the sacrificial components 62 are substantially coplanar, the end surface 151 of the second conductive pillar 15 is thus substantially coplanar with the end surface 141 of the first conductive pillar 14. After attaching the first semiconductor 12 (and the second semiconductor 13, if applicable) to the carrier 60, the dielectric material 64 may be fully cured (e.g., 220° C., 30 min) to be in a C-stage.

Referring to FIG. 11, an encapsulant 16 is formed on the dielectric material 64 and covers the first semiconductor die 12, the second semiconductor 13, the first conductive pillar 14 and the second conductive pillar 15. The encapsulant 16 may cover the active surface 121, the back side surface 122 and the lateral surface 123 of the semiconductor die 12. The encapsulant 16 has a first surface 161 and a second surface 162 opposite to the first surface 161. The first surface 161 is disposed on the exposed surface 641 of dielectric material 64. The second surface 162 may be above the first semiconductor die 12 and the second semiconductor die 13. In other words, the first semiconductor die 12 and the second semiconductor die 13 may be embedded in the encapsulant 16. The first surface 161 of the encapsulant 16 may be conformal with the exposed surface 641 of the dielectric material 64. Accordingly, a groove 164 is defined between the encapsulant 16 and the first conductive pillar 14. The groove 164 is adjacent to and surrounds the first conductive pillar 14, and is filled by the protrusion 644 of the dielectric material 64. Similarly, another groove 166 is defined between the encapsulant 16 and the second conductive pillar 15 disposed on the second semiconductor die 13.

The encapsulant 16 may include a plurality of fillers with an average diameter. A distance D is defined between the first surface 161 of the encapsulant 16 and the active surface 121 of the first semiconductor die 12. The distance D is greater than, or substantially equal to, about three times the average diameter of the fillers, such that the fillers in the encapsulant 16 can flow smoothly into a space between the active surface 121 of the semiconductor die 12 and the exposed surface 641 of the dielectric material 64. If a plurality of semiconductor dice are included in the semiconductor package structure, the distance D may be defined as a minimum distance between the first surface 161 of the encapsulant 16 and the active surfaces of the semiconductor dice.

Figure 12:
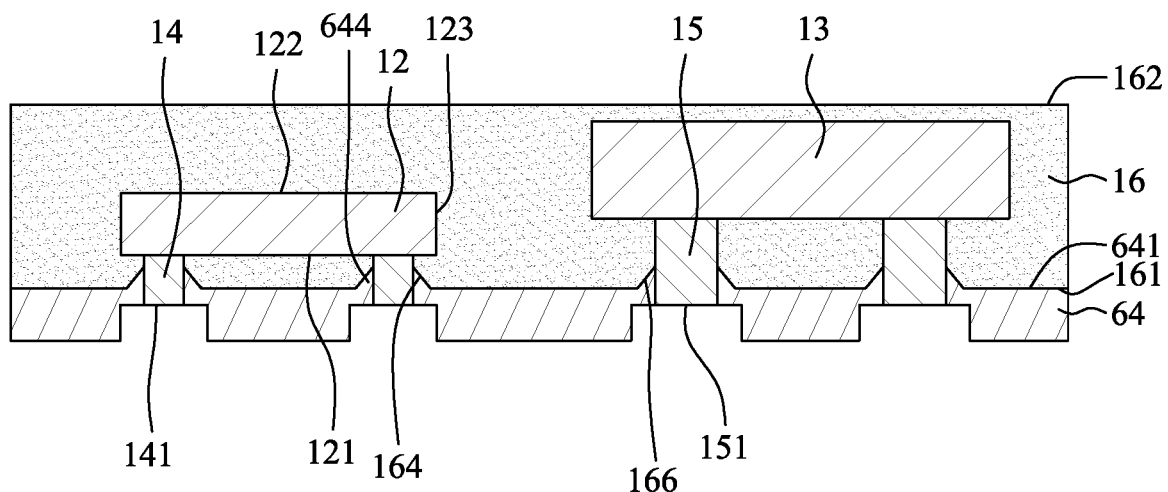
FIG. 12 illustrates one or more stages of an example of a method for manufacturing a semiconductor package structure according to some embodiments of the present disclosure.

Referring to FIG. 12, the carrier 60 is removed by, for example, stripping. Since the sacrificial component 62 bonds tightly to the carrier 60, in some embodiments, the sacrificial component 62 may also be removed along with the carrier 60. Alternatively, in some other embodiments, the sacrificial component 62 may be removed by, e.g., etching. As shown in FIG. 12, with the carrier 60 and the sacrificial component 62 removed, the end surface 141 of the first conductive pillar 14 and the end surface 151 of the second conductive pillar 15 are exposed.

Figure 13:
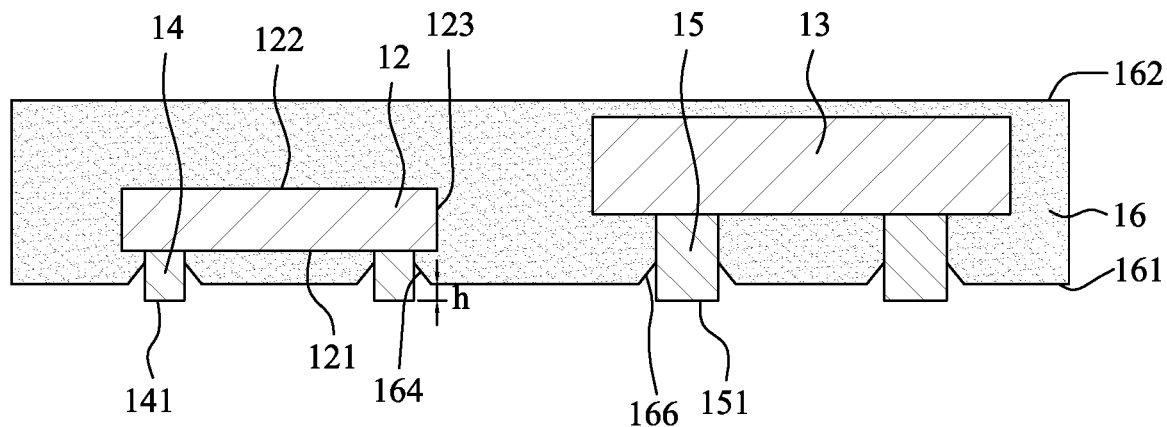
FIG. 13 illustrates one or more stages of an example of a method for manufacturing a semiconductor package structure according to some embodiments of the present disclosure.

Referring to FIG. 13, the dielectric material 64 is removed by, for example, washing or chemical etching, to expose the first conductive pillar 14 and the second conductive pillar 15. Accordingly, a portion of the first conductive pillar 14 and a portion of the second conductive pillar 15 protrude from the first surface 161 of the encapsulant 16. It is noteworthy that by adjusting a thickness of the sacrificial component 62, a height h of the portion of the first conductive pillar 14 that protrudes from the encapsulant 16 can be precisely controlled. In some embodiments, a promoter layer may be further disposed on the first surface 161 of the encapsulant 16 for enhancing adhesion between the first surface 161 and a layer (e.g., a first dielectric layer 24) formed or disposed thereon.

Figure 14:
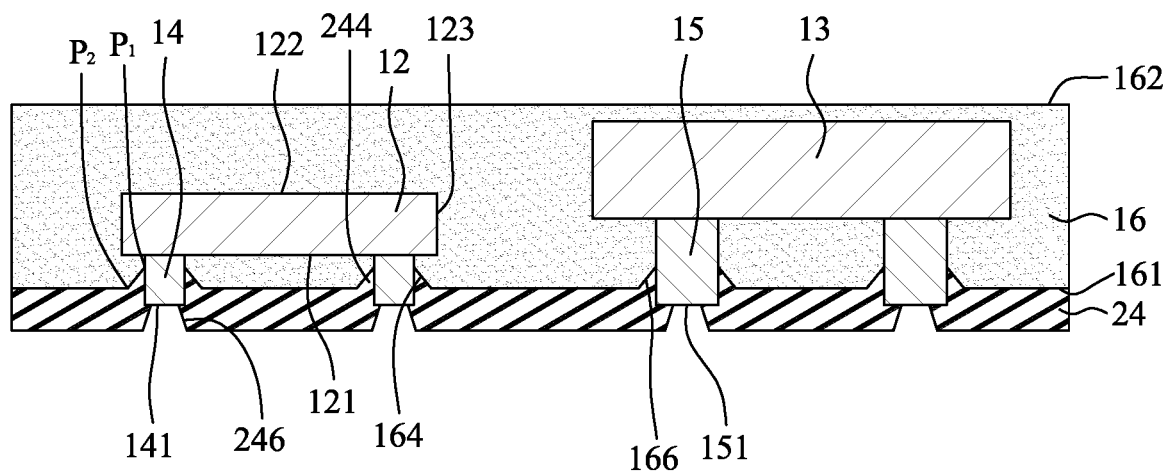
FIG. 14 illustrates one or more stages of an example of a method for manufacturing a semiconductor package structure according to some embodiments of the present disclosure.

Referring to FIG. 14, a first dielectric layer 24 is formed or disposed on the encapsulant 16. The first dielectric layer 24 is disposed on the first surface 161 of the encapsulant 16 and in the grooves 164, 166 of the encapsulant 16. As shown in FIG. 14, the first conductive pillar 14 and the second conductive pillar 15 do not extend fully through the first dielectric layer 24. The first dielectric layer 24 includes a plurality of protrusions 244 surrounding the first conductive pillar 14 and the second conductive pillar 15 and filled in the grooves 164, 166 defined by the encapsulant 16. The first dielectric layer 24 defines a plurality of openings 246 to expose the end surface 141 of the first conductive pillar 14 and the end surface 151 of the second conductive pillar 15. A material of the first dielectric layer 24 may be epoxy or PI including photoinitiators, and the openings 246 may be formed by, e.g., lithography techniques.

As shown in FIG. 14, the first dielectric layer 24 has a first thickness $T_1$ (as illustrated in FIG. 2) at a first position $P_1$ and a second thickness $T_2$ (as illustrated FIG. 2) at a second position $P_2$. The first position $P_1$ is closer to the first conductive pillar 14 than the second position $P_2$. The first thickness $T_1$ is greater than the second thickness $T_2$.

Figure 15:
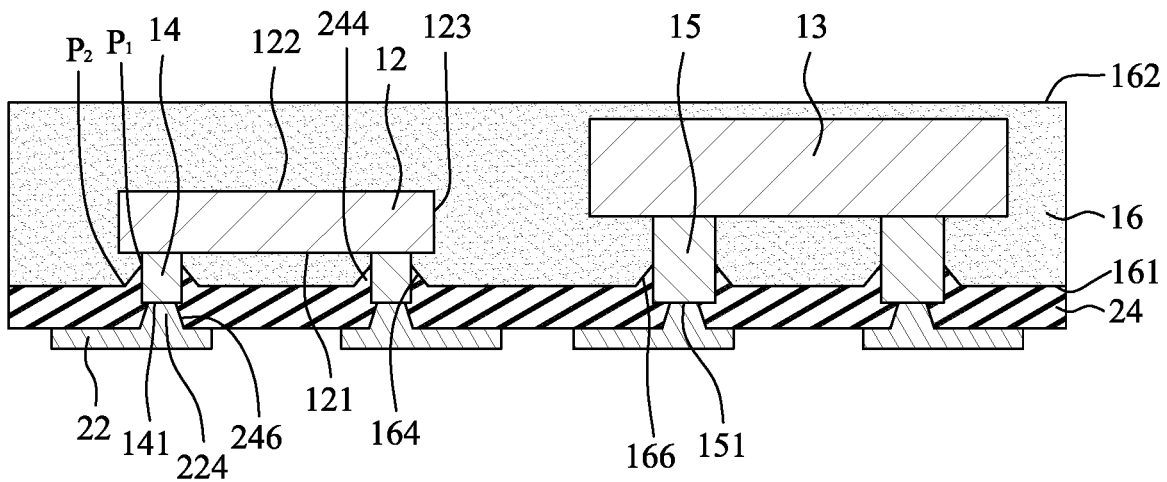
FIG. 15 illustrates one or more stages of an example of a method for manufacturing a semiconductor package structure according to some embodiments of the present disclosure.

Referring to FIG. 15, a first circuit structure 22 is formed on the first dielectric layer 24 and electrically connected to the first conductive pillar 14 and the second conductive pillar 15. The first circuit structure 22 may include a redistribution layer. The first circuit structure 22 may include a plurality of vias 224 disposed in the openings 246 of the first dielectric layer 24 and contacting the end surface 141 of the first conductive pillar 14 and the end surface 151 of the second conductive pillar 15.

Figure 16:
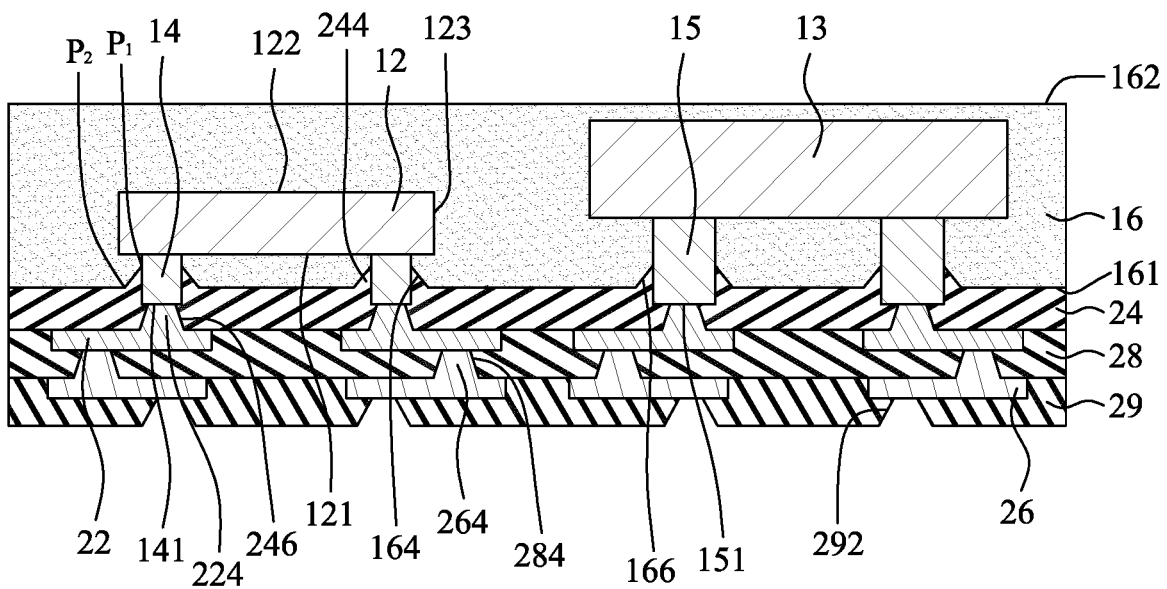
FIG. 16 illustrates one or more stages of an example of a method for manufacturing a semiconductor package structure according to some embodiments of the present disclosure.

Referring to FIG. 16, a second dielectric layer 28, a second circuit structure 2 and a third dielectric layer 29 are formed or disposed on the first dielectric layer 24. Then, at least one external connector 294 (e.g., including a UBM layer 295 and a solder ball 296) is formed or disposed in the opening 292 of the third dielectric layer 29 and electrically connected to the second circuit structure 26. Therefore, the semiconductor package structure 1 as shown in FIGS. 1 and 2 is manufactured.

According to the manufacturing method of the present disclosure, such as that described above, a grinding operation can be omitted, thus eliminating a manufacturing cost of the grinding operation. Besides, such manufacturing method insures that the end surface(s) of the conductive pillar(s) (e.g., the end surface 141 of the first conductive pillar 14 and the end surface 151 of the second conductive pillar 15) can be exposed. In the case that the semiconductor package structure includes multiple semiconductor dice (e.g., the first semiconductor die 12 and the second semiconductor 13) having conductive pillars (e.g., the first conductive pillar 14 and the second conductive pillar 15) having different heights, end surfaces (e.g., the end surface 141 and the end surface 151) of the conductive pillars are substantially coplanar.

In some other embodiments, in the stage shown in FIG. 9, after pre-curing of the dielectric material 64, the method may further include pre-treating the exposed surface 641 of the dielectric material 64 by, for example, plasma etching, wet etching or bombardment, so as to provide a roughness of the exposed surface 641 greater than about 0.008 such as about 0.01 or greater, or about 0.02 μm or greater. Hence, a roughness of the first surface 161 of the encapsulant 16 formed on the exposed surface 641 of the dielectric material 64 may be greater than about 0.008 such as about 0.01 μm or greater, or about 0.02 μm or greater. Accordingly, the semiconductor package structure 1c as shown in FIG. 6 can be manufactured.

Figure 17:
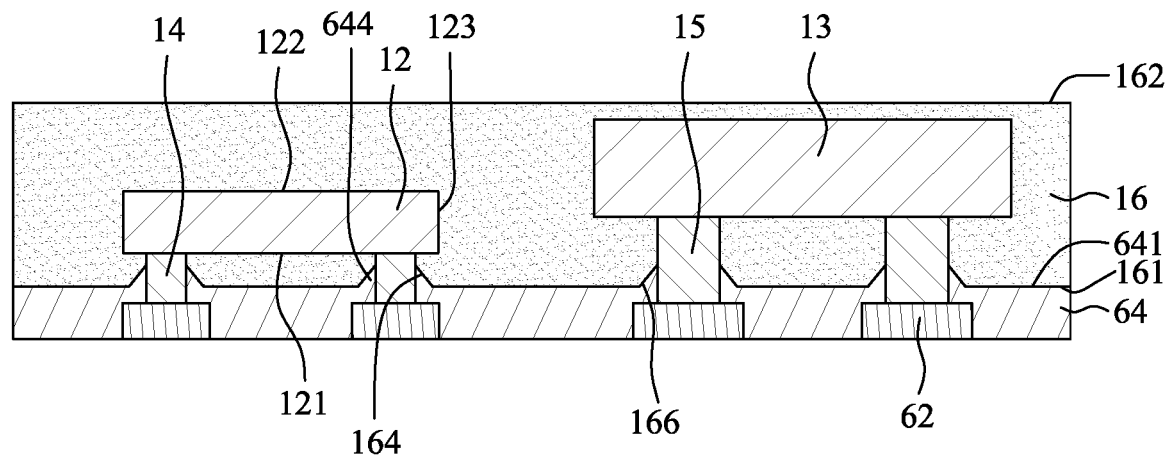
FIG. 17 illustrates one or more stages of an example of a method for manufacturing a semiconductor package structure according to some embodiments of the present disclosure.

FIG. 17 to FIG. 22 illustrate a method for manufacturing a semiconductor package structure according to some embodiments of the present disclosure. In some embodiments, the method is for manufacturing a semiconductor package structure such as the semiconductor package structure 1a shown in FIG. 3. The initial stages of the illustrated method may be the same as the stages illustrated in FIG. 7 to FIG. 11. However, in the method illustrated in FIG. 17 to FIG. 22, the bonding strength between the sacrificial component 62 and the carrier 60 may be weaker than the bonding strength between the sacrificial component 62 and the carrier 60 in the method illustrated in FIG. 12 to FIG. 16. FIG. 17 depicts a stage subsequent to that depicted in FIG. 11.

Referring to FIG. 17, the carrier 60 is removed by, for example, stripping. Since bonding strength between the sacrificial component 62 and the carrier 60 is relatively weak, the sacrificial component 62 may remain embedded in the dielectric material 64.

Figure 18:
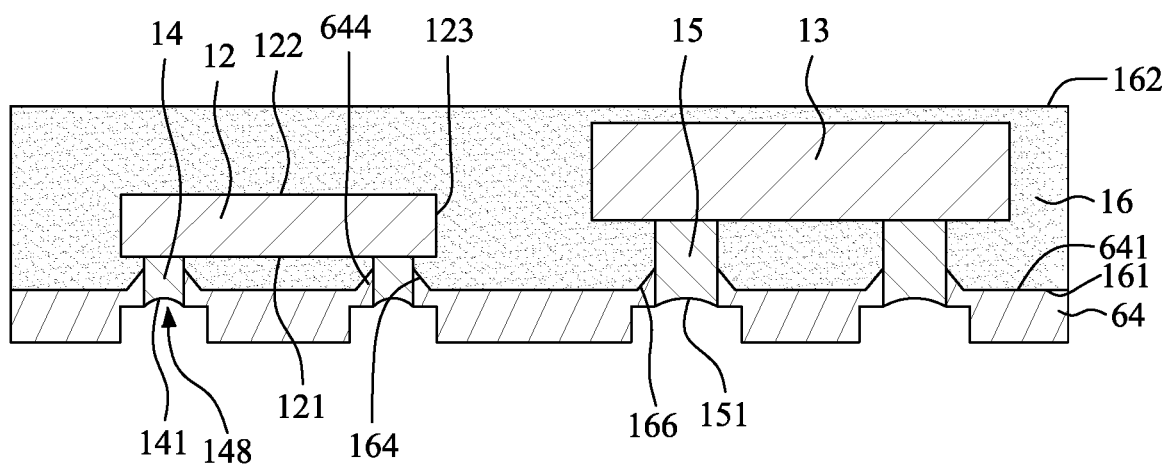
FIG. 18 illustrates one or more stages of an example of a method for manufacturing a semiconductor package structure according to some embodiments of the present disclosure.

Referring to FIG. 18, the sacrificial component 62 is removed. Since the sacrificial component 62 may be a metal pad, removing the sacrificial component 62 may include removing the metal pad by etching and forming a recess portion 148 on the end surface 141 of the first conductive pillar 14. That is, a portion of the first conductive pillar 14 may also be removed during the etching process, thus forming the recess portion 148 on the end surface 141 of the first conductive pillar 14.

Figure 19:
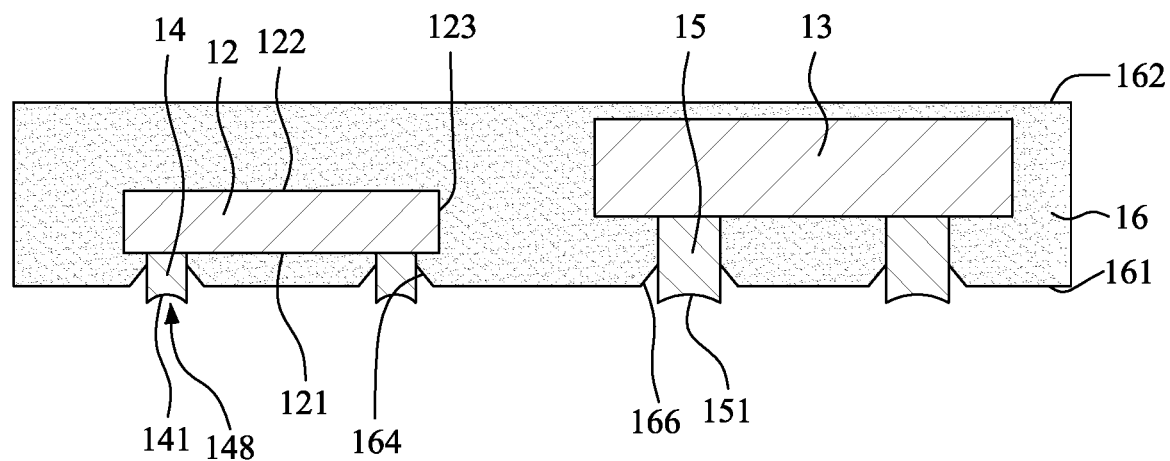
FIG. 19 illustrates one or more stages of an example of a method for manufacturing a semiconductor package structure according to some embodiments of the present disclosure.

Referring to FIG. 19, the dielectric material 64 is removed by, for example, washing or chemical etching, to expose the first conductive pillar 14 and the second conductive pillar 15. Accordingly, a portion of the first conductive pillar 14 and a portion of the second conductive pillar 15 protrude from the encapsulant 16.

Figure 20:
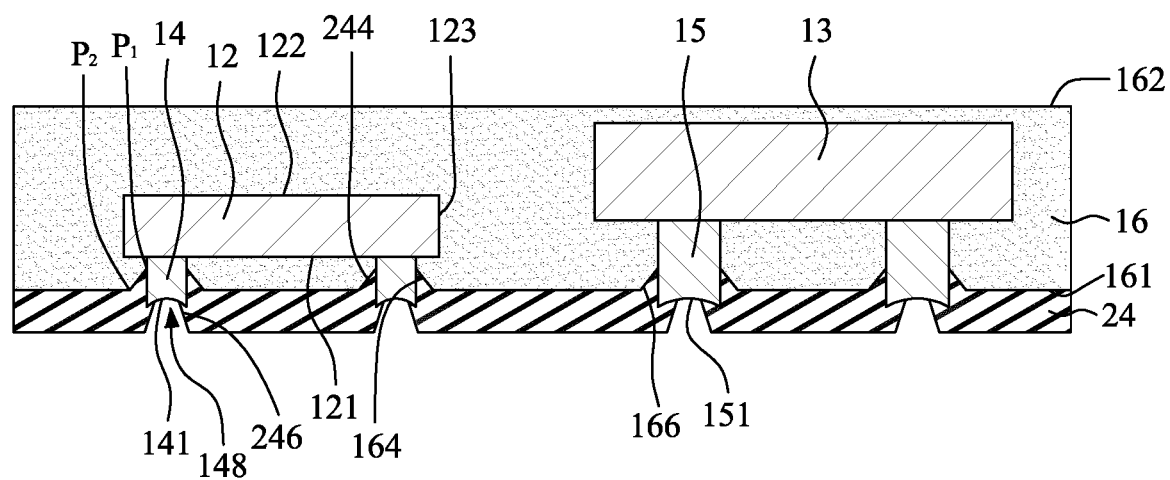
FIG. 20 illustrates one or more stages of an example of a method for manufacturing a semiconductor package structure according to some embodiments of the present disclosure.

Referring to FIG. 20, a first dielectric layer 24 is formed or disposed on the encapsulant 16. The first dielectric layer 24 is disposed on the first surface 161 of the encapsulant 16 and in the grooves 164, 166 of the encapsulant 16. As shown in FIG. 20, the first conductive pillar 14 and the second conductive pillar 15 do not extend fully through the first dielectric layer 24. The first dielectric layer 24 includes a plurality of protrusions 244 surrounding the first conductive pillar 14 and the second conductive pillar 15 and filled in the grooves 164, 166 defined by the encapsulant 16. The first dielectric layer 24 defines a plurality of opening 246 to expose at least a portion of the end surface 141 of the conductive pillar 14 and at least a portion of the end surface 151 of the second conductive pillar 15.

Figure 21:
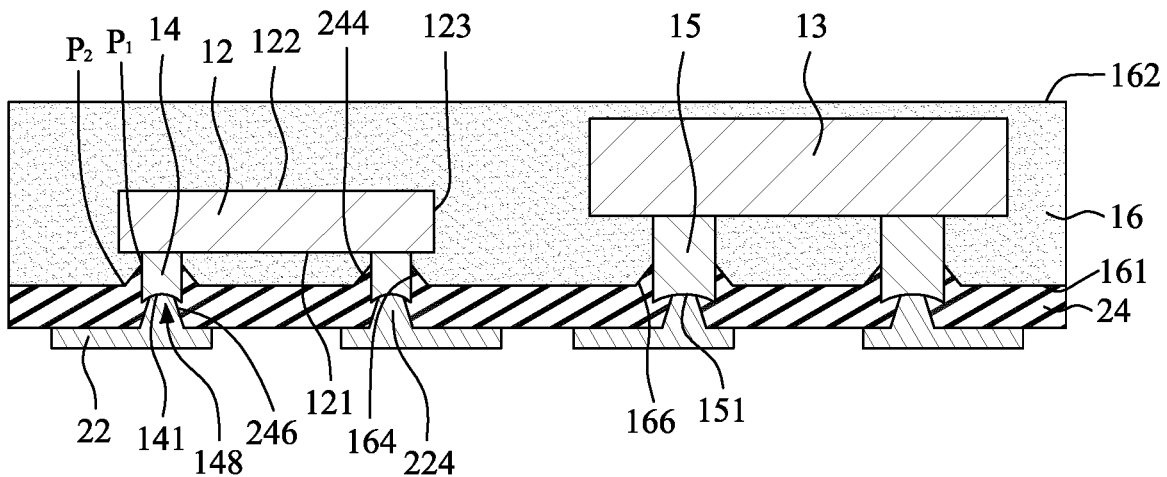
FIG. 21 illustrates one or more stages of an example of a method for manufacturing a semiconductor package structure according to some embodiments of the present disclosure.

Referring to FIG. 21, the first circuit structure 22 is formed on the first dielectric layer 24 and electrically connected to the first conductive pillar 14 and the second conductive pillar 15. The first circuit structure 22 further extends into the recess portion 148 defined by the end surface 141 of the first conductive pillar 14. The first circuit structure 22 may include a plurality of vias 224 disposed in the openings 246 of the first dielectric layer 24 and extending into the recess portion 148 to contact the end surface 141 of the first conductive pillar 14.

Figure 22:
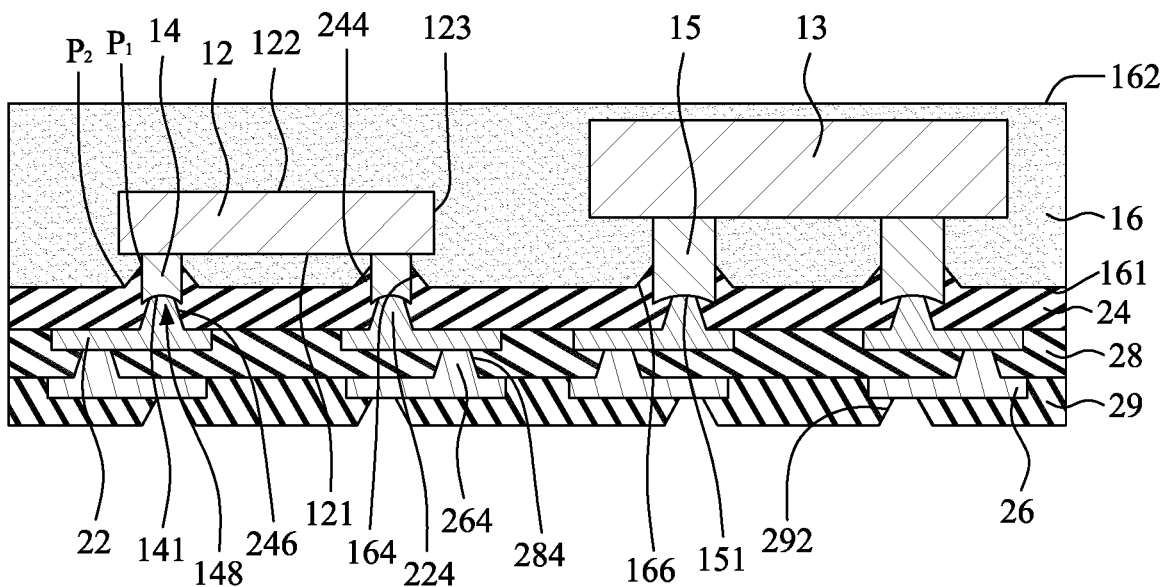
FIG. 22 illustrates one or more stages of an example of a method for manufacturing a semiconductor package structure according to some embodiments of the present disclosure.

Referring to FIG. 22, a second dielectric layer 28, a second circuit structure 2, a third dielectric layer 29 and at least one external connector 294 (e.g., including an UBM layer 295 and a solder ball 296) are formed or disposed on the first dielectric layer 24. Thus, the semiconductor package structure 1a as shown in FIG. 3 is manufactured.

Figure 23:
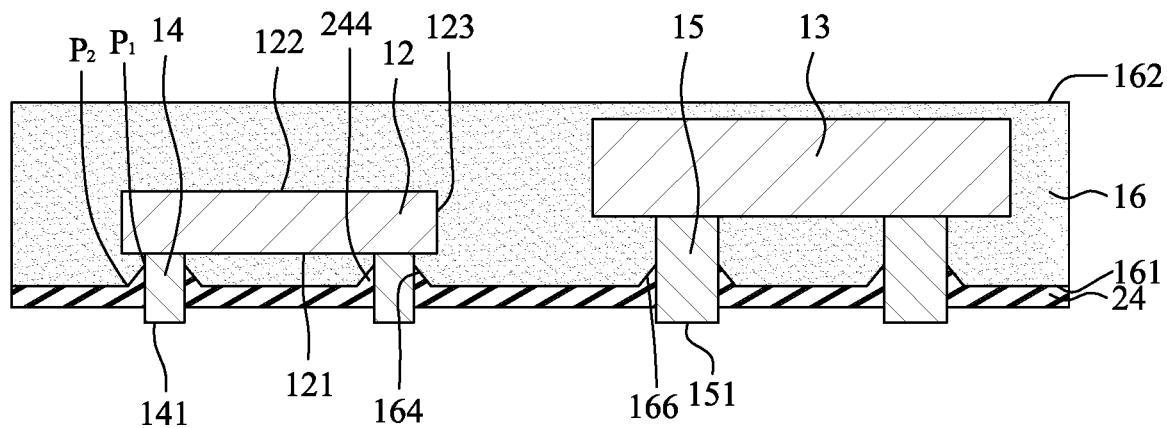
FIG. 23 illustrates one or more stages of an example of a method for manufacturing a semiconductor package structure according to some embodiments of the present disclosure.
Figure 24:
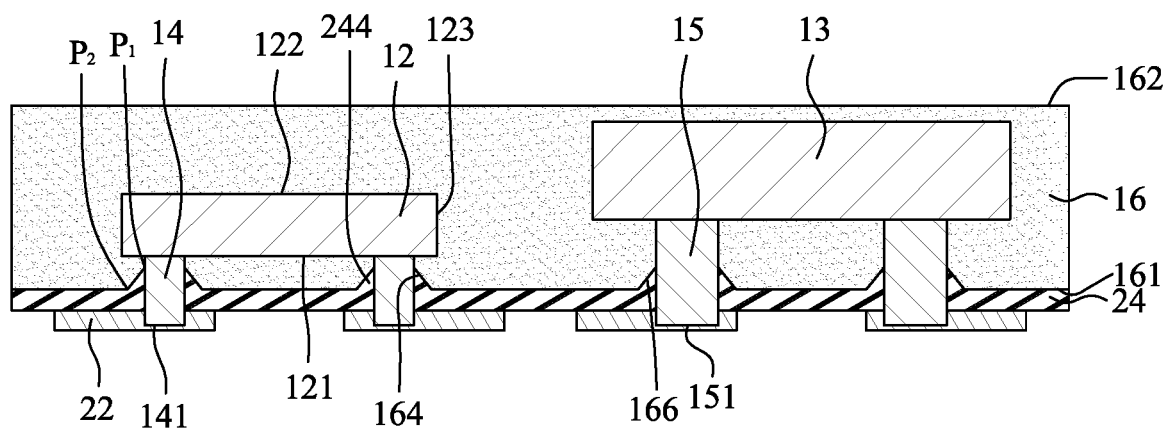
FIG. 24 illustrates one or more stages of an example of a method for manufacturing a semiconductor package structure according to some embodiments of the present disclosure.
Figure 25:
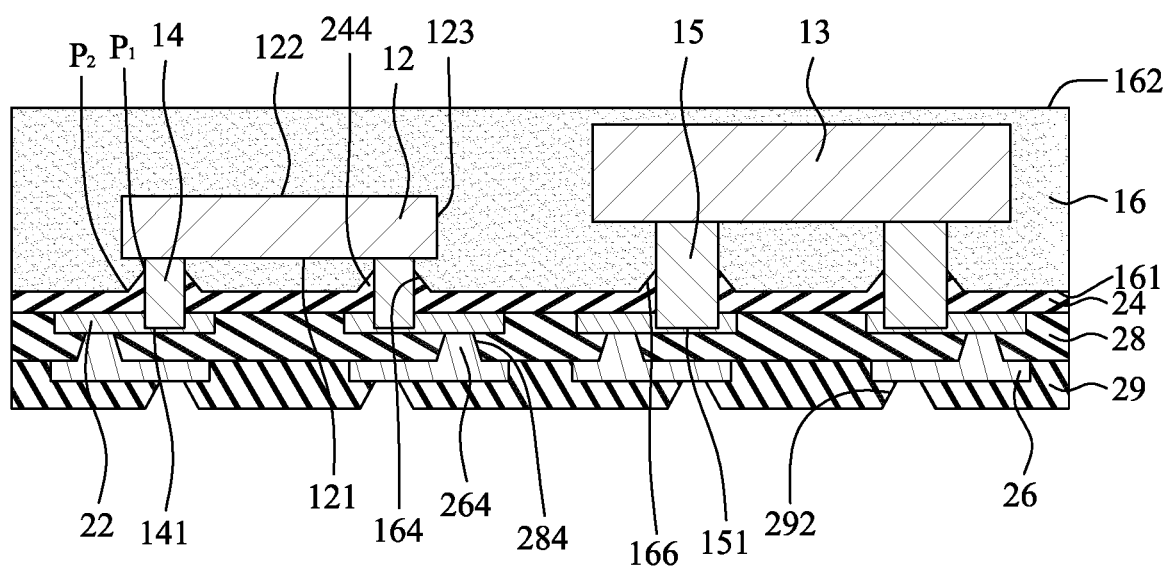
FIG. 25 illustrates one or more stages of an example of a method for manufacturing a semiconductor package structure according to some embodiments of the present disclosure.

FIG. 23 to FIG. 25 illustrate a method for manufacturing a semiconductor package structure according to some embodiments of the present disclosure. In some embodiments, the method is for manufacturing a semiconductor package structure such as the semiconductor package structure 1b shown in FIGS. 4 and 5. The initial stages of the illustrated method may be the same as the stages illustrated in FIG. 7 to FIG. 13. FIG. 23 depicts a stage subsequent to that depicted in FIG. 13.

Referring to FIG. 23, a first dielectric layer 24 is formed or disposed on the encapsulant 16. The first dielectric layer 24 is disposed on the first surface 161 of the encapsulant 16 and in the grooves 164, 166 of the encapsulant 16. The first dielectric layer 24 includes a protrusion 244 surrounding the first conductive pillar 14 and the second conductive pillar 15 and filled in the grooves 164, 166 defined by the encapsulant 16. As shown in FIG. 23, the first conductive pillar 14 and the second conductive pillar 15 extend fully through the first dielectric layer 24. That is, the first conductive pillar 14 includes a portion protruding from the first dielectric layer 24. Similarly, the second conductive pillar 15 also includes a portion protruding from the first dielectric layer 24.

Referring to FIG. 24, a first circuit structure 22 is formed on the first dielectric layer 24 and electrically connected to the first conductive pillar 14 and the second conductive pillar 15. The portion of the first conductive pillar 14 protruding from the first dielectric layer 24 is thus embedded in the first circuit structure 22. Similarly, the portion of the second conductive pillar 15 protruding from the first dielectric layer 24 is also embedded in the first circuit structure 22.

Referring to FIG. 25, a second dielectric layer 28, a second circuit structure 2, a third dielectric layer 29 and at least one external connector 294 (e.g., including an UBM layer 295 and a solder ball 296) are formed or disposed on the first dielectric layer 24. Thus, the semiconductor package structure 1b as shown in FIGS. 4 and 5 is manufactured.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first semiconductor die having an active surface;
   a second semiconductor die having an active surface;
   a first conductive pillar disposed adjacent to the active surface of the first semiconductor die;
   a second conductive pillar disposed adjacent to the active surface of the second semiconductor die, wherein a height of the first conductive pillar is different from a height of the second conductive pillar, and an end surface of the first conductive pillar of the first semiconductor die is substantially coplanar with an end surface of the second conductive pillar of the second semiconductor die;
   an encapsulant covering the first semiconductor die, the second semiconductor die, the first conductive pillar and the second conductive pillar, wherein the encapsulant defines a first groove adjacent to and surrounding the first conductive pillar and a second groove adjacent to and surrounding the second conductive pillar, and a maximum depth of the first groove is substantially the same as a depth of the second groove; and
   a circuit structure electrically connected to and in direct contact with the first conductive pillar and the second conductive pillar, wherein the circuit structure comprises a redistribution layer.

2. The semiconductor package substrate of claim 1, wherein the encapsulant includes a plurality of fillers with an average diameter, the encapsulant has a first surface adjacent to the active surface of the first semiconductor die, and a distance between the first surface of the encapsulant and the active surface of the first semiconductor die is at least three times the average diameter of the fillers.

3. The semiconductor package structure of claim 1, further including a dielectric layer disposed on the encapsulant and in the first groove of the encapsulant, wherein a height of a portion of the first conductive pillar protruding from the encapsulant is greater than a minimum thickness of the dielectric layer.

4. The semiconductor package structure of claim 1, wherein the encapsulant covers a lateral surface and a back side surface of the first semiconductor die.

5. The semiconductor package structure of claim 1, wherein an end surface of the first conductive pillar defines a recess portion.

6. The semiconductor package structure of claim 5, wherein the circuit structure extends into the recess portion of the end surface of the first conductive pillar.

7. The semiconductor package structure of claim 6, wherein the circuit structure includes a redistribution layer.

8. The semiconductor package structure of claim 1, further comprising:
a dielectric layer disposed on the encapsulant, wherein the dielectric layer includes a protrusion surrounding the first conductive pillar.

9. The semiconductor package structure of claim 8, wherein the dielectric layer is disposed on a surface of the encapsulant, and a roughness of the surface of the encapsulant is greater than about 0.008 µm.

10. The semiconductor package structure of claim 8, wherein the dielectric layer has a first thickness at a first position and a second thickness at a second position, the first position is closer to the first conductive pillar than the second position, and the first thickness is greater than the second thickness.

11. The semiconductor package structure of claim 8, wherein the first conductive pillar protrudes from the dielectric layer, and is embedded in the circuit structure.

12. The semiconductor package structure of claim 8, wherein the dielectric layer covers the first conductive pillar and defines an opening to expose an end surface of the first conductive pillar, and the circuit structure is disposed on the dielectric layer and in the opening of the dielectric layer.

13. The semiconductor package structure of claim 8, wherein the protrusion of the dielectric layer is conformal with and disposed in the first groove defined by the encapsulant.

14. The semiconductor package structure of claim 8, wherein the circuit structure include a plurality of vias contacting an end surface of the first conductive pillar and an end surface of the second conductive pillar.

15. A semiconductor package structure comprising:
a first semiconductor die having an active surface;
a second semiconductor die having an active surface;
a first conductive pillar disposed adjacent to the active surface of the first semiconductor die;
a second conductive pillar disposed adjacent to the active surface of the second semiconductor die, wherein a height of the first conductive pillar is different from a height of the second conductive pillar, and an end surface of the first conductive pillar of the first semiconductor die is substantially coplanar with an end surface of the second conductive pillar of the second semiconductor die;
an encapsulant covering the first semiconductor die, the second semiconductor die, the first conductive pillar and the second conductive pillar, wherein the encapsulant defines a first groove adjacent to and surrounding the first conductive pillar and a second groove adjacent to and surrounding the second conductive pillar;
a circuit structure electrically connected to and in direct contact with the first conductive pillar and the second conductive pillar, wherein the circuit structure comprises a redistribution layer; and
a dielectric layer, wherein the dielectric layer covers the first conductive pillar and the second conductive pillar, and defines a plurality of openings to expose the end surfaces of the first conductive pillar and the second conductive pillar, and the circuit structure is disposed on the dielectric layer and in the openings of the dielectric layer.

* * * * *